(12) United States Patent
Asamura et al.

(10) Patent No.: US 7,061,336 B2
(45) Date of Patent: Jun. 13, 2006

(54) HIGH FREQUENCY OSCILLATOR

(75) Inventors: Fumio Asamura, Saitama (JP); Takeo Oita, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 4 days.

(21) Appl. No.: 10/698,003

(22) Filed: Oct. 30, 2003

(65) Prior Publication Data

US 2004/0233004 A1  Nov. 25, 2004

(30) Foreign Application Priority Data

Oct. 30, 2002  (JP) .............................. 2002-315581

(51) Int. Cl.
*H03B 11/10* (2006.01)

(52) U.S. Cl. .................... 331/107 SL; 331/107 DP; 331/117 D; 331/96; 331/99

(58) Field of Classification Search .......... 331/107 SL, 331/108 C, 107 DP, 74, 117 D, 96, 99
See application file for complete search history.

(56) References Cited

U.S. PATENT DOCUMENTS 5,138,284 A    8/1992  Yabuki et al.
6,703,904 B1 *  3/2004  Aikawa et al. ............... 331/56

FOREIGN PATENT DOCUMENTS

JP      4-175001      8/1992

* cited by examiner

*Primary Examiner*—Arnold Kinkead
(74) *Attorney, Agent, or Firm*—Katten Muchin Rosenman LLP

(57) ABSTRACT

A high frequency oscillator which obtains an oscillation output by combining the outputs of two oscillators has a substrate, first and second amplifiers for oscillation so disposed that their output ends be opposite each other, first and second signal lines each configuring a closed oscillation loop by connecting the input ends and the output ends of the first and second amplifiers, respectively, these being disposed on a first principal surface of the substrate, and a grounding conductor disposed on a second principal surface of the substrate and configuring a strip line together with each of the signal lines. An opening, where the grounding conductor is removed, is bored in the second principal surface and a coplanar line structure is configured by arranging the first and second signal lines close to each other in the area of the opening.

6 Claims, 6 Drawing Sheets

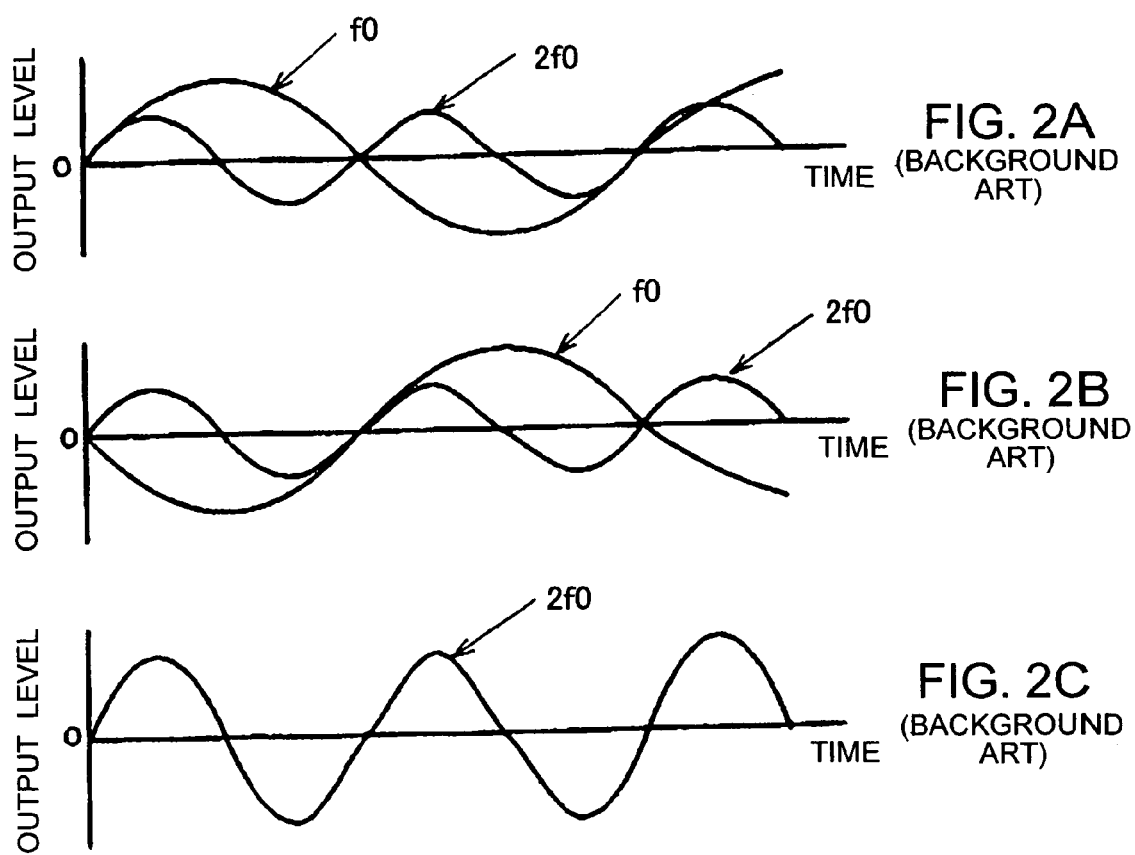

HIGH FREQUENCY OSCILLATOR

BACKGROUND OF THE INVENTION

1. Technical Field of the Invention

The present invention relates to a high frequency oscillator for generating signals of frequencies in the millimeter wave or microwave band, and more particularly to a high frequency oscillator which obtains an oscillation output by combining the outputs of a first oscillator and a second oscillator having the same oscillation frequency.

2. Description of the Related Art

A high frequency oscillator whose oscillation frequencies range approximately from 1 GHz to 100 GHz is useful as, for instance, the oscillation source of a high frequency line network interlocked with optical cables or the oscillation source of a measuring instrument. One of high frequency oscillators uses, as disclosed in the Japanese Patent Laid-Open Application No. 4-175001 (JP, 4-175001, A) for example, is a so-called push-push type oscillator which uses two oscillators generating a fundamental frequency signal and outputs a second harmonics signal that of the fundamental frequency signal by combining the outputs of these oscillators. Hereinafter, such an oscillator generating a second harmonics signal will be referred to as a double frequency oscillator.

FIG. 1 shows an example of configuration of a conventional double frequency oscillator. This double frequency oscillator is composed of resonator 1, first oscillating unit 2a, second oscillating unit 2b and combiner 3.

Resonator 1 uses, for instance, a dielectric resonator, LC elements disposed in an IC (integrated circuit), or a microstrip line. Each of oscillating units 2a and 2b involves an amplifier for oscillation and a feedback line, and they constitute first and second oscillators of the same oscillation frequency (fundamental frequency signal) f0 by sharing resonator 1. However, they are so arranged that the fundamental frequency signal outputs from the respective oscillators have a phase difference of 180 degree, i.e. to be reverse in phase to each other. Combiner 3, which is an in-phase combiner consisting of a differential amplifier for instance, combines the outputs of the oscillators and externally supplies combined output fout.

FIG. 2A to FIG. 2C show the respective output waveforms of the output of first oscillating unit 2a, the output of second oscillating unit 2b and combined output fout in the circuit shown in FIG. 1. In the circuit shown in FIG. 1, as the outputs of fundamental frequency signal f0 from first and second oscillating units 2a and 2b are reversed in phase, by 180 degrees to each other, as shown in FIG. 2A and FIG. 2B, the fundamental frequency signal components fout are cancelled with each other to be reduced to 0 in the combined output as shown in FIG. 2C. On the other hand, regarding the second harmonic signal (2f0) whose frequency is double that of fundamental frequency signal f0, as the outputs of first and second oscillating units 2a and 2b are identical in phase, they are combined by combiner 3 and outputted as combined output fout. Eventually, in the circuit shown in FIG. 1, out of the oscillation components from the oscillating units, the fundamental frequency signal and its odd number-order harmonics are cancelled with each other and are not outputted. Whereas even number-order harmonics from the oscillating units are combined and doubled in level, the second harmonic signal 2f0 becomes the highest level in combined output fout when it is outputted because even number-order harmonics of quadruple and higher-order harmonic signals are far lower in level than the second harmonic signal.

However, the second harmonic signal oscillator shown in FIG. 1, as it requires combiner 3 for combining the outputs of first and second oscillating units 2a and 2b, involves the difficulty of reducing the size. Furthermore, oscillation frequency (fundamental frequency signal) components from first and second oscillating units 2a and 2b including combiner 3 should be kept reverse in phase to, i.e. at a phase difference of 180 degrees from, each other, and this poses a difficulty in electrical circuit designing.

SUMMARY OF THE INVENTION

An object of the present invention is to provide a high frequency oscillator which contributes to size reduction and facilitates such designing as its two oscillating units generate oscillation in phases reverse to each other.

The object of the present invention is achieved by a high frequency oscillator which obtains an oscillation output by combining the outputs of two oscillators, the high frequency oscillator comprising a substrate, first and second amplifiers for oscillation so disposed on a first principal surface of the substrate that their output ends be opposite each other, a first signal line disposed on the first principal surface and configuring a closed oscillation loop by connecting the input end and the output end of the first amplifier, a second signal line disposed on the first principal surface and configuring a closed oscillation loop by connecting the input end and the output end of the second amplifier, and a grounding conductor disposed on a second principal surface of the substrate and configuring a strip line together with each of the signal lines, wherein an opening, where the grounding conductor is removed, is bored in the second principal surface and a coplanar line structure is configured by arranging the first and second signal lines close to each other in the area of the opening.

According to the present invention, high frequency components in an unbalanced mode traveling over the signal lines of the microstrip line structure, in each closed oscillation loop, travel in a balanced mode due to the coplanar line structure in the area of the opening. When traveling in the balanced mode, between adjoining signal lines high frequency components travel in a reverse phase mode in which they have reverse potentials. As a result, the amplifiers for oscillation of the two closed oscillation loops inevitably oscillate in phases reverse to each other. Therefore, if the outputs of the oscillation loops are combined, the fundamental frequency signal are cancelled with each other to enable a double frequency signal to be taken out. Therefore according to the present invention, size reduction is facilitated, and such designing as to allow the two oscillators generate oscillation in phases reverse to each other is made easier.

BRIEF DESCRIPTION OF THE DRAWINGS

FIG. 2A to FIG. 2C are waveform diagrams showing the respective output waveforms of the output of the first oscillating unit, the output of the second oscillating unit and combined output fout in the circuit shown in FIG. 1;

DETAILED DESCRIPTION OF THE INVENTION

Figure 1:
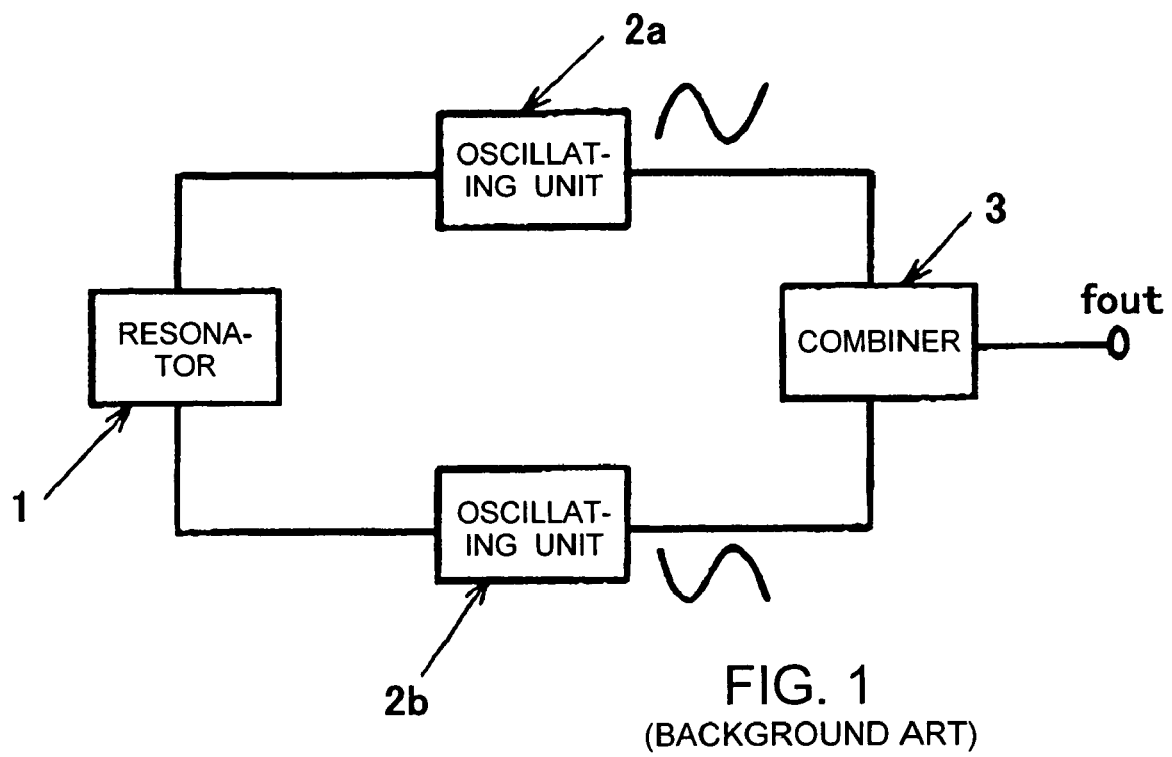
FIG. 1 is a block diagram showing the configuration of a conventional double frequency oscillator.
Figure 3A:
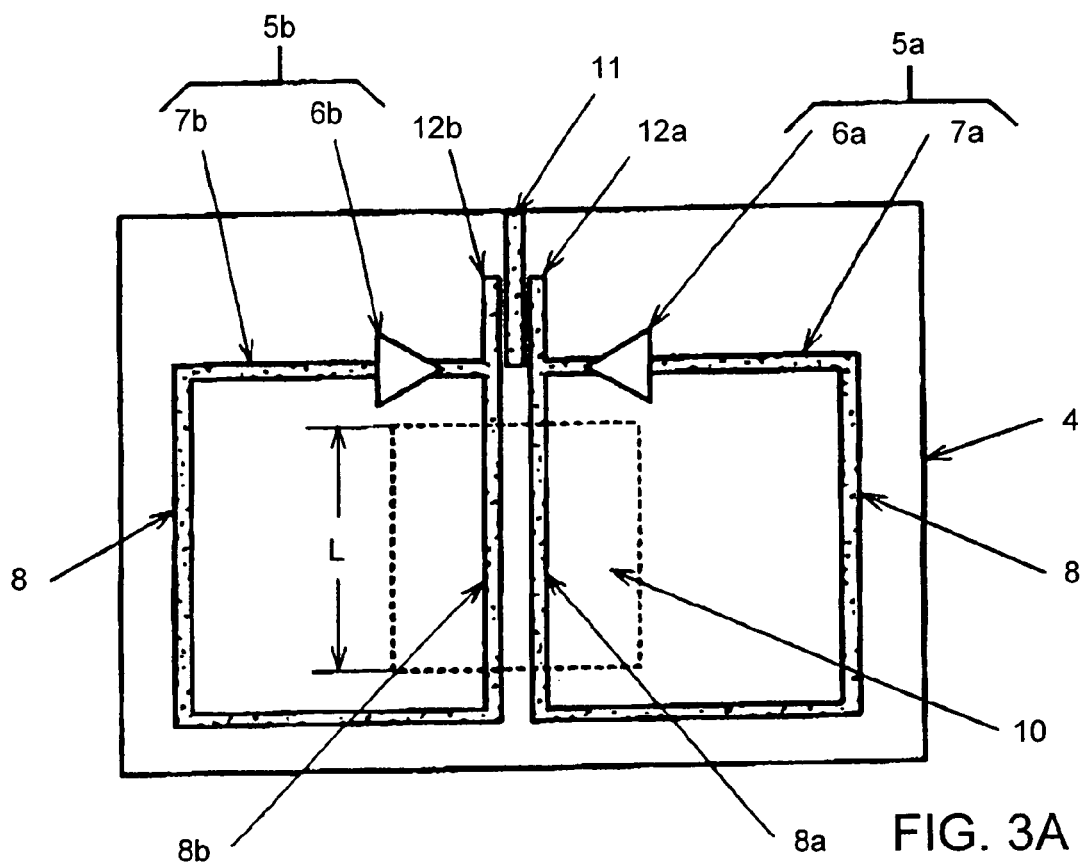
FIG. 3A and FIG. 3B are respectively a plan and a rear view of a double frequency oscillator according to a first embodiment of the present invention.
Figure 3B:
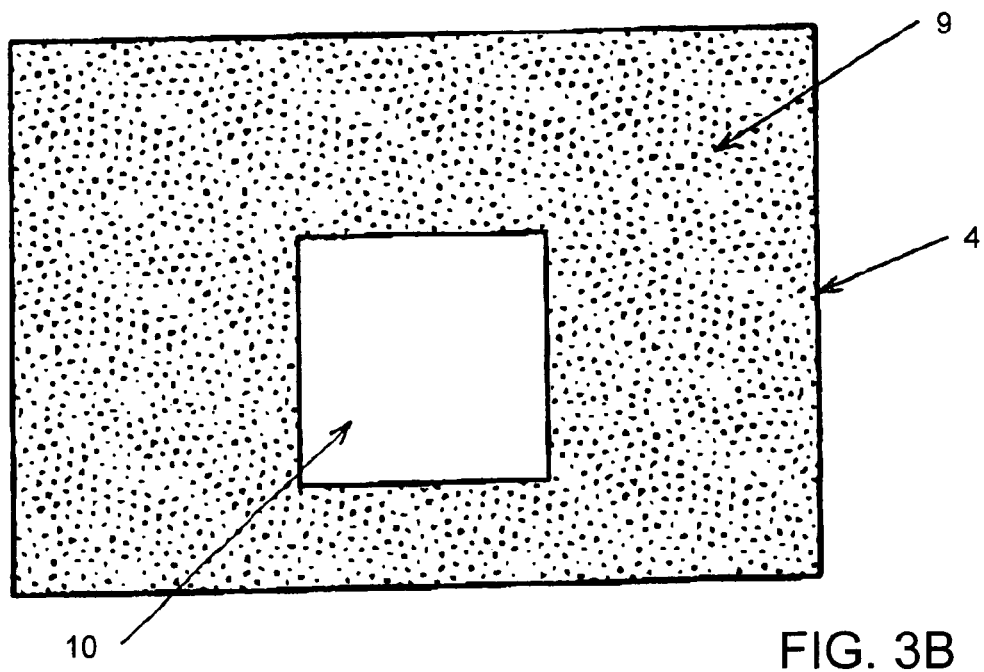

The double frequency oscillator according to the first embodiment of the present invention shown in FIG. 3A and FIG. 3B is provided with first oscillator 5a, second oscillator 5b and combined output line 11 disposed on substrate 4 consisting of a dielectric. First oscillator 5a comprises first oscillation amplifier 6a and first transmission path 7a. Similarly, second oscillator 5b comprises second oscillation amplifier 6b and second transmission path 7b. Amplifiers 6a and 6b, which output the same oscillation frequency (fundamental frequency signal) f0, are so arranged on one principal surface of substrate 4 that their output ends be opposite each other. On the other principal surface of substrate 4 is disposed grounding conductor 9 all over except over opening 10 to be described afterwards. Although not shown here, there are also provided power supply lines and grounding lines for oscillators 6a and 6b.

Each of transmission paths 7a and 7b has signal line 8 disposed on one principal surface of substrate 4; signal line 8 of first oscillator 5a is so disposed on the one principal surface of substrate 4 as to connect the output end and the input end of amplifier 6a to form a closed oscillation loop, and similarly signal line 8 of second oscillator 5b is so disposed on the one principal surface of substrate 4 as to connect the output end and the input end of amplifier 6b to form a closed oscillation loop. On that one principal surface of substrate 4, there is a section in which the signal lines of both transmission paths 7a and 7b run in parallel to each other. Signal lines 8 in this parallel running section will be referred to as adjoining signal line portions 8a and 8b. The oscillation frequencies of oscillators 5a and 5b are determined by the electric lengths of transmission paths 7a and 7b including amplifiers 6a and 6b.

On the other main face of substrate 4, grounding conductor 9 is removed correspondingly to the area in which adjoining signal line portions 8a and 8b are formed, and this constitutes opening 10 in grounding conductor 9. The length of opening 10 in adjoining signal line portions 8a and 8b is represented by L.

Therefore, in other areas than opening 10, each of transmission paths 7a and 7b has a microstrip line structure consisting of signal line 8 and grounding conductor 9. In the area in which opening 10 is bored, adjoining signal line portions 8a and 8b constitute a coplanar line structure.

On the one principal surface of substrate 4, combined output line 11 consisting of a microstrip line-structured signal line is disposed, close to the output ends of amplifiers 6a and 6b. At the output end of first amplifier 6a, lead-out line 12a protrudes from signal line 8 by a length equal to a quarter of the wavelength of double wave 2f0, and similarly at the output end of second amplifier 6b lead-out line 12b protrudes from signal line 8 by a length equal to a quarter of the wavelength of second harmonic signal 2f0. In other words, lead-out lines 12a and 12b have a protruding length equal to ⅛ of wavelength λ of fundamental frequency signal f0. Both lead-out lines 12a and 12b are disposed in parallel and close to combined output line 11 on the one principal surface of substrate 4, and are thereby electromagnetically coupled to combined output line 11. The oscillation output of this high frequency oscillator can be taken out from combined output line 11.

Next will be described the oscillating operation of this high frequency oscillator.

When power supply is turned on, i.e. amplifiers 6a and 6b are activated, first and second oscillators 5a and 5b are caused to oscillate by the traveling of high frequency components over transmission paths 7a and 7b. The outputs in an unbalanced mode traveling over the transmission paths of the microstrip line structure from oscillators 5a and 5b travel, being converted into a balanced mode due to the coplanar line structure in the area in which adjoining signal line portions 8a and 8b run parallel, and after that are again converted into the unbalanced mode, traveling over the microstrip line structure to be fed back to amplifiers 6a and 6b.

Here, the high frequency components in the balanced mode due to the coplanar line structure travel in a reverse phase mode between adjoining signal line portions 8a and 8b. Thus they travel while generating an electric field from one adjoining signal line portion 8a to the other adjoining signal line portion 8b. When the potential of one adjoining signal line portion 8a is positive the potential of the other adjoining signal line portion 8b is negative, the two signal components being reverse in phase to each other. This means that the high frequency component in the reverse phase mode is made dominant by increasing length L of opening 10 constituting the coplanar line structure, and first amplifier 6a and second amplifier 6b come to oscillate reverse in phase to each other.

If the outputs of first amplifier 6a and second amplifier 6b are combined under such conditions of oscillation, fundamental frequency signals f0 will be cancelled with each other as stated above and second harmonic signal 2f0 will be combined and outputted. Here, combined output line 11 is electromagnetically coupled to lead-out lines 12a and 12b in a wavelength equal to ¼ of the wavelength of the second harmonic signal. On combined output line 11, as the output of first amplifier 6a and the output of second amplifier 6b are combined reverse in phase to each other, a signal component of second harmonic signal 2f0 can be obtained from the combined output line.

Figure 4:
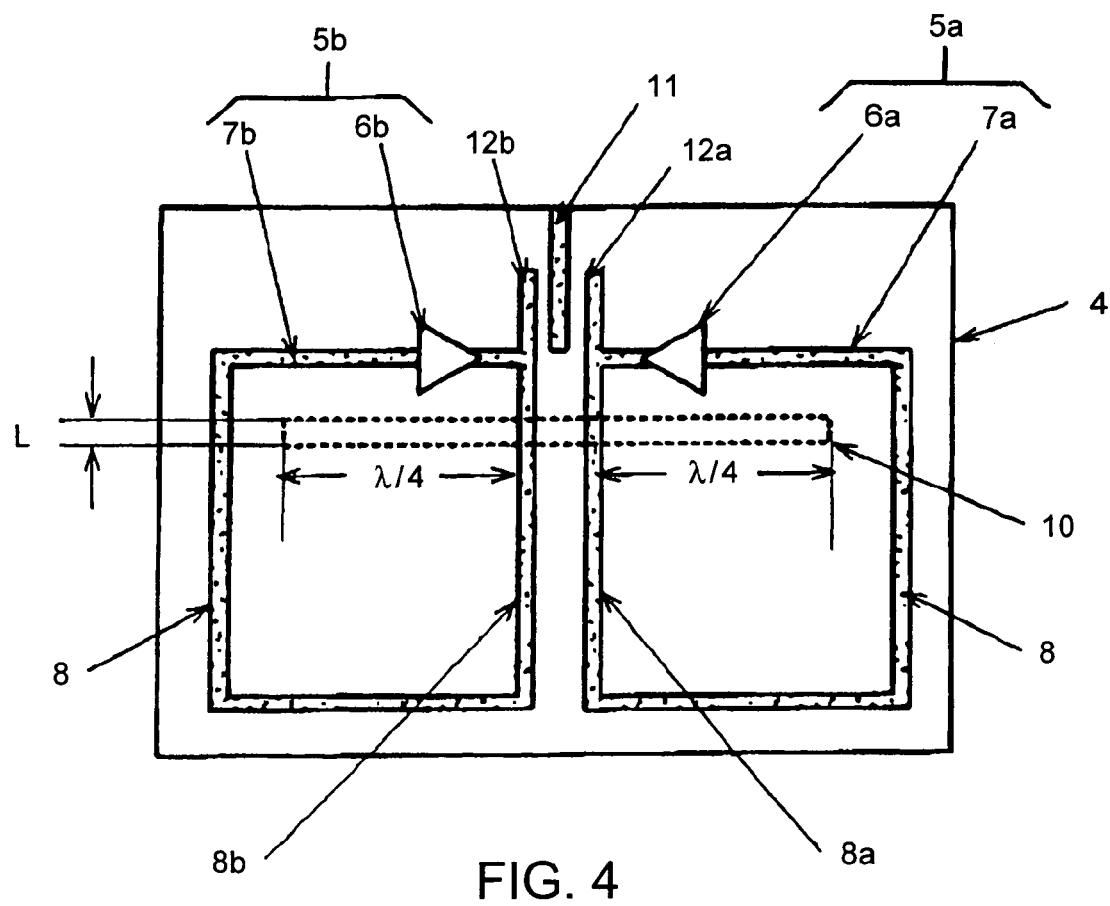
FIG. 4 is a plan view of a double frequency oscillator according to a second embodiment of the present invention.

Next will be described a double frequency oscillator according to a second embodiment of the present invention with reference to FIG. 4.

While two amplifiers 6a and 6b are caused to oscillate reverse in phase to each other by enlarging length L of opening 10 bored in grounding conductor 9 to form a coplanar line in the above-described double frequency oscillator in the first embodiment, in this second embodiment of length L of opening 10 along adjoining signal line portions 8a and 8b is rather shortened. Instead, the protruding length of opening 10 from the positions of adjoining signal line portions 8a and 8b in the direction orthogonal to the extending direction of adjoining signal line portions 8a and 8b is set to approximately λ/4, λ being a wavelength corresponding to fundamental frequency signal f0.

In this way, the components of fundamental frequency signal f0 propagating over transmission paths 7a and 7b of the microstrip line structure will be cut off in the position of opening 10, and only the components in the reverse phase mode will pass the position of opening 10 via the coplanar line structure.

As length L of opening 10 can be shortened according to the structure in the second embodiment, the overall size of the high frequency oscillator can be reduced.

Next will be described a double frequency oscillator according to a third embodiment of the present invention. The double frequency oscillator according to the third embodiment is a version of the double frequency oscillator in the first embodiment enabled to perform injection locking to increase the Q value of the oscillator and thereby enhance the stability of the oscillation frequency.

Figure 5:
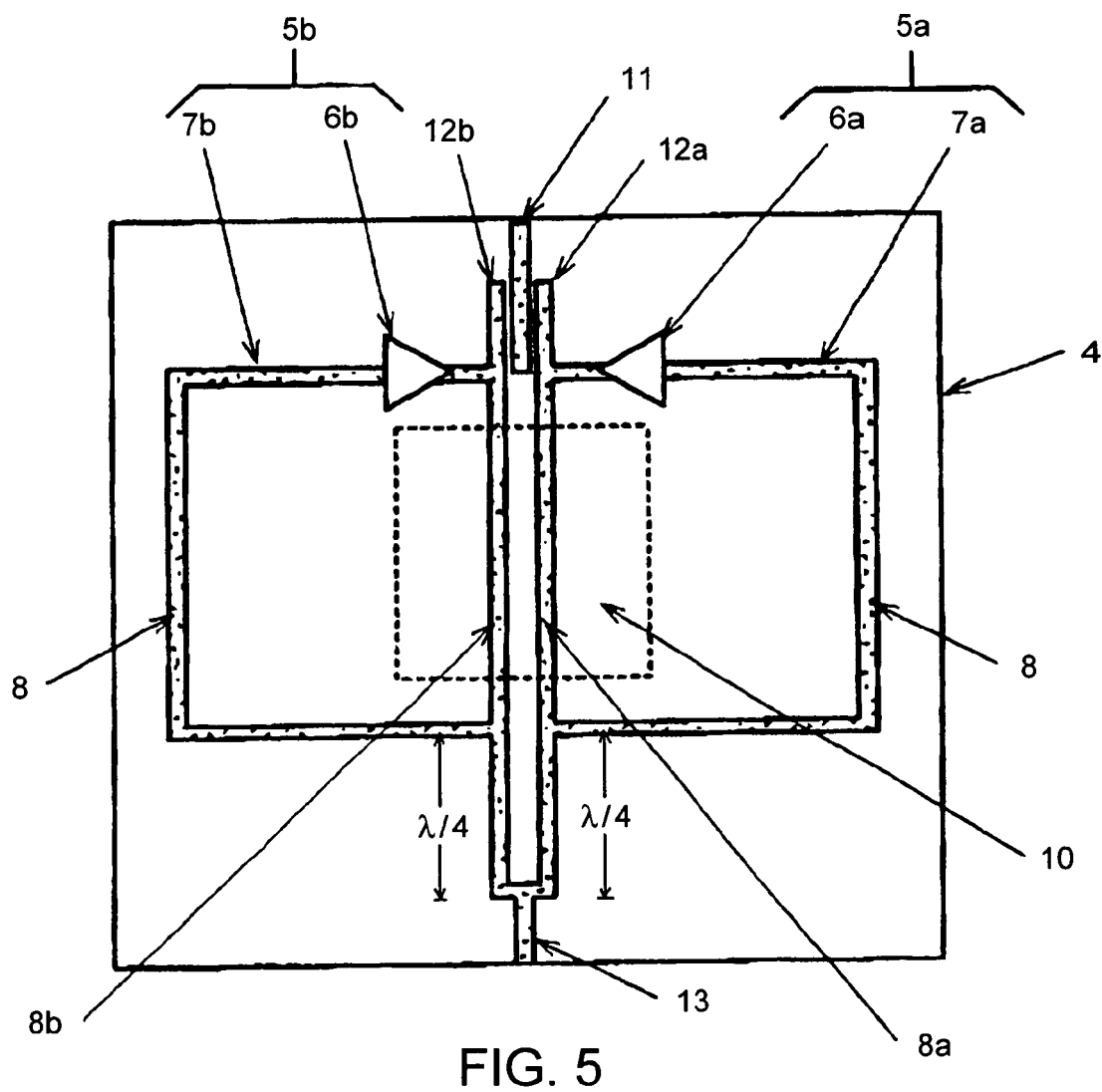
FIG. 5 is a plan view of a double frequency oscillator which uses injection locking, based on a third embodiment of the present invention.

The double frequency oscillator according to the third embodiment shown in FIG. 5 is a version of the double frequency oscillator in the first embodiment wherein signal line 8 of first oscillator 5a and signal line 8 of second oscillator 5b are connected in common and injection line 13 for injecting a synchronizing signal is connected there. Injection line 13, which has a microstrip line structure, is disposed on the one principal surface of substrate 4 on the other side than combined output line 11. Each of signal lines 8 protrudes, until it reaches the connection point shared with injection line 13, by about $\lambda/4$, $\lambda$ representing the wavelength of fundamental frequency signal f0.

This double frequency oscillator can use as the synchronizing signal injected from injection line 13 an oscillation frequency having a large Q value and high stability such as, for instance, an overtone oscillation frequency or multiplied oscillation frequency by a quartz crystal oscillator. The frequency of the synchronizing signal is equal to 1/n (where n is an integer) of the oscillation frequency (fundamental wave f0) of the high frequency oscillator. In the following description, n=2 is supposed.

Figure 6A:
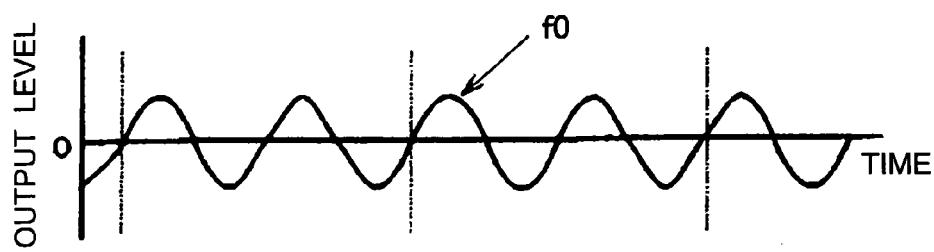
FIG. 6A to FIG. 6C are waveform diagrams showing the respective waveforms of the output of a first amplifier, the output of a second amplifier and a synchronizing signal in the circuit shown in FIG. 5.
Figure 6B:
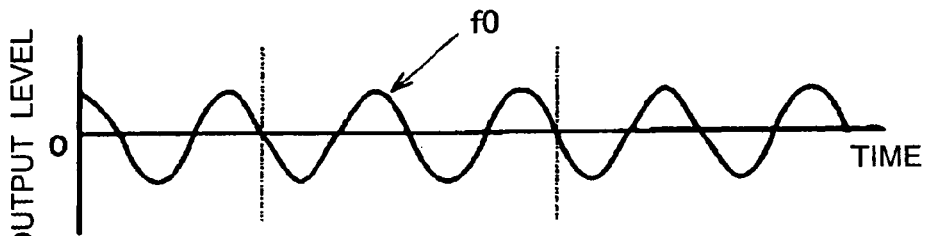
Figure 6C:
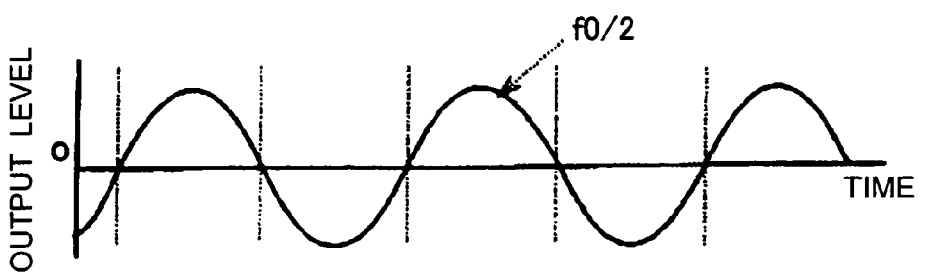

In a circuit configured in this way, high frequency components in the closed oscillation loops of first and second amplifiers 6a and 6b are aligned in phase by the synchronizing signal from injection line 13. Supposing that the synchronizing signal is given as shown in FIG. 6C in this case, as the synchronizing signal is f0/2 relative to fundamental frequency signal f0 of the double frequency oscillator, the fundamental frequency signal f0 component in each closed oscillation loop is synchronized at every $2\lambda$ of wavelength as shown in FIG. 6A and FIG. 6B. However, since the outputs of the two closed oscillation loops are reverse in phase to each other, they become synchronized with a lag of $\lambda$ in wavelength equivalent each time. As this serves to stabilize fundamental wave f0, the double wave 2f0 component obtained from combined output line 11 is also stabilized as a result.

Incidentally, although in this case a quartz crystal oscillator is used for fundamental frequency signal f0 (for instance 1 GHz) of the high frequency oscillator to obtain a synchronizing signal of f0/2 (500 MHz) in frequency with an overtone or by multiplying, the fundamental frequency signal of the quartz crystal oscillator can be used as the synchronizing signal because 100 MHz can be obtained by using a synchronizing signal of f0/10. Since a multiplying circuit or the like would be unnecessary in that case, this contributes to reductions in size and cost. To add, for a quartz crystal oscillator, the approximately 500 MHz mentioned above would be the maximum in the state of the art even if the number of multiplying is increased.

What is claimed is:

1. A high frequency oscillator which obtains an oscillation output by combining outputs of two oscillators, the high frequency oscillator comprising:
    a substrate;
    first and second amplifiers for oscillation so disposed on a first principal surface of said substrate that their output ends be opposite each other;
    a first signal line disposed on said first principal surface and configuring a closed oscillation loop by interconnecting an input end and the output end of said first amplifier;
    a second signal line disposed on said first principal surface and configuring a closed oscillation loop by interconnecting an input end and the output end of said second amplifier; and
    a grounding conductor disposed on a second principal surface of said substrate and configuring a strip line together with each of said signal lines, wherein
    an opening, where said grounding conductor is removed, is bored in said second principal surface and a coplanar line structure is configured by arranging said first and second signal lines close to each other in an area of said opening.

2. The high frequency oscillator according to claim 1, wherein the oscillation frequencies of said first and second amplifiers are identical.

3. The high frequency oscillator according to claim 2, wherein a combined output line for combining outputs of said closed oscillation loops is so disposed as to be close to the output ends of said first and second amplifiers.

4. The high frequency oscillator according to claim 3, wherein a first lead-out line protruding from said first signal line and a second lead-out line protruding from said second signal line are disposed close to said combined output line, and each of said lead-out lines has a protruding length equal to $\frac{1}{8}$ of a wavelength corresponding to said oscillation frequency and is electromagnetically coupled to said combined output line.

5. The high frequency oscillator according to claim 2, wherein each of lengths from positions of said first and second signal lines to the two ends of said opening in a direction orthogonal to an extending direction of said first and second signal lines in the area of said opening is equal to a quarter of a wavelength corresponding to said oscillation frequency.

6. The high frequency oscillator according to claim 1, further comprising an injection line for injecting a synchronizing signal, wherein said first and second signal lines are connected in common to said injection line.

* * * * *